(12) United States Patent
Stiebeiner et al.

(10) Patent No.: US 11,719,651 B2
(45) Date of Patent: Aug. 8, 2023

(54) PART INSPECTION METHOD USING COMPUTED TOMOGRAPHY

(71) Applicant: FARO Technologies, Inc., Lake Mary, FL (US)

(72) Inventors: Ariane Stiebeiner, Stuttgart (DE); Georgio Balatzis, Fellbach (DE); Simon Raab, Santa Barbara, CA (US); Stefan Wagner, Renningen (DE)

(73) Assignee: FARO TECHNOLOGIES, INC., Lake Mary, FL (US)

( * ) Notice: Subject to any disclaimer, the term of this patent is extended or adjusted under 35 U.S.C. 154(b) by 228 days.

(21) Appl. No.: 17/340,902

(22) Filed: Jun. 7, 2021

(65) Prior Publication Data

US 2022/0042930 A1 Feb. 10, 2022

Related U.S. Application Data

(60) Provisional application No. 63/061,213, filed on Aug. 5, 2020.

(51) Int. Cl.
*G01N 23/046* (2018.01)
*G01N 23/20025* (2018.01)
*G06F 30/20* (2020.01)

(52) U.S. Cl.
CPC ..... *G01N 23/046* (2013.01); *G01N 23/20025* (2013.01); *G06F 30/20* (2020.01); *G01N 2223/3075* (2013.01)

(58) Field of Classification Search
CPC ......... G01N 2223/3075; G01N 23/046; G01N 23/20025; G06F 30/20
See application file for complete search history.

(56) References Cited

U.S. PATENT DOCUMENTS 5,559,334 A * 9/1996 Gupta ............... G01C 11/02
250/358.1
5,703,782 A * 12/1997 Dundorf ............ G05B 19/4097
700/184

(Continued)

FOREIGN PATENT DOCUMENTS

WO WO-2005119174 A1 * 12/2005 ........... A61B 6/4417
WO WO-2014118367 A1 * 8/2014 ............. G01B 15/00

OTHER PUBLICATIONS

Albright, Brian, CT Scanning: A New Way to Look at Parts, Digital Engineering 24/7 Partners, Jul. 1, 2016; 10 pages.

(Continued)

*Primary Examiner* — Mark R Gaworecki
(74) *Attorney, Agent, or Firm* — McCarter & English, LLP; Dave S. Christensen; David K. Kincaid

(57) ABSTRACT

A system and method of inspecting a plurality of objects using a computed tomography (CT) system is provided. The method includes acquiring an image of a fixture used for holding the plurality of objects with the CT system. A first electronic model of the fixture is generated. The objects are placed in the fixture. An image of the fixture and the objects is acquired with the CT system. A second electronic model of the fixture and the objects is generated. A third electronic model of the objects is defined based at least in part on subtracting the first electronic model from the second electronic model. Dimensions of the objects from the third electronic model are compared with a computer aided design (CAD) model. A report is output based at least in part on the comparison of the objects from the third electronic model with the CAD model.

20 Claims, 3 Drawing Sheets

(56) References Cited

U.S. PATENT DOCUMENTS

| | | | | |
|---|---|---|---|---|
| 5,848,115 | A | * | 12/1998 | Little .................. G06T 17/00 382/152 |
| 6,341,153 | B1 | * | 1/2002 | Rivera ................ G01N 23/046 378/10 |
| 2010/0194749 | A1 | * | 8/2010 | Nightingale ........... G06T 7/001 378/4 |
| 2017/0176181 | A1 | | 6/2017 | Machii et al. |
| 2019/0277778 | A1 | * | 9/2019 | Lodge .................. G06T 7/0004 |
| 2019/0318479 | A1 | * | 10/2019 | Ajri ..................... G06T 7/0014 |

OTHER PUBLICATIONS

Automated CT scanning enables 100% inspection of complex parts (Jun. 27, 2017) 4 pages, retreived from Interest https://blog.nikonmetrology.com/automated-ct-inspection-complex-parts/ on May 6, 2021.

The Inside Story on Industrial CT Scanning, 3d Scanning For Quality & Design (Apr. 1, 2016) Quality Magazine, 7 pages.

Zeiss CT Solutions, Computer Tomography for Quality Assurance and Process Inspection, Catalog 36 pgs, retrieved from Internet on May 6, 2021 https://www.msiviking.com/documents/ZEISS/CT/ZEISS_CT_Solutions_Catalog.pdf.

* cited by examiner

PART INSPECTION METHOD USING COMPUTED TOMOGRAPHY

CROSS REFERENCE TO RELATED APPLICATIONS

This application claims the benefit of U.S. Provisional Application Ser. No. 63/061,213, filed Aug. 5, 2020, the contents of which is incorporated herein by reference.

BACKGROUND

The subject matter disclosed herein relates to a computed tomography system and method for inspecting objects, and in particular to a system and method for inspecting a plurality of objects simultaneously.

Computed tomography (CT) systems provide a non-invasive means for inspecting objects. A CT system emits x-rays that pass into and through an object. The measurement of these x-rays allows the generation of 2D x-ray images of the object. In some systems, the objects are rotated in the scanner and imaged hundreds of time. These 2D images are combined together into a three-dimensional (3D) voxel (volumetric pixel) data set. From this voxel data set, a surface can be extracted and stored as a 3D point cloud. The 3D point cloud may be used to measure the object being inspected.

To scan the object in a CT system, a fixture is typically made to hold and support the object. Often, these fixtures are made from a foam material to reduce the effect of absorption. This fixture can cause irregularities in the part surface, which slows down processing of the data or makes accurate measurements on the surface model impossible. Further, while the cycle time for a single scan may be on the order of a few minutes, which may be acceptable for low volume object, it may be unacceptable for use in higher volume environments that desire the scan to be a few seconds.

Accordingly, while existing CT inspection systems are suitable for their intended purposes the need to improvement remains, particularly in providing a CT inspection system and method that reduces cycle times for inspecting objects.

BRIEF DESCRIPTION

According to one aspect of the disclosure, a method of inspecting a plurality of objects using a computed tomography (CT) system is provided. The method includes acquiring an image of a fixture used for holding the plurality of objects with the CT system. A first electronic model of the fixture is generated. The plurality of objects are placed in the fixture. An image of the fixture and the plurality of objects is acquired with the CT system. A second electronic model of the fixture and the plurality of objects is generated. A third electronic model of the plurality objects is defined based at least in part on subtracting the first electronic model from the second electronic model. Dimensions of the objects from the third electronic model are compared with a computer aided design (CAD) model. A report is output based at least in part on the comparison of the objects from the third electronic model with the CAD model.

In addition to one or more of the features described herein, or as an alternative, further embodiments of the method may include defining a bounding box around each of the plurality of objects. In addition to one or more of the features described herein, or as an alternative, further embodiments of the method may include the defining of the bounding box by generating a histogram of the third electronic model and determining a first peak and a second peak in the histogram. In addition to one or more of the features described herein, or as an alternative, further embodiments of the method may include the first peak representing the background of the third electronic model and the second peak represents the plurality of objects.

In addition to one or more of the features described herein, or as an alternative, further embodiments of the method may include defining a threshold, the threshold being between the first peak and the second peak. In addition to one or more of the features described herein, or as an alternative, further embodiments of the method may include the bounding box being defined by the threshold.

In addition to one or more of the features described herein, or as an alternative, further embodiments of the method may include the subtraction of the first electronic model from the second electronic model is performed voxel by voxel. In addition to one or more of the features described herein, or as an alternative, further embodiments of the method may include aligning a fixture portion of first electronic model with a fixture portion of the second electronic model. In addition to one or more of the features described herein, or as an alternative, further embodiments of the method may include the aligning is based on being a best fit or an iterative closest point method. In addition to one or more of the features described herein, or as an alternative, further embodiments of the method may include the aligning being based on mechanical alignment of the fixture to a reproducible position within the CT system.

According to another aspect of the disclosure, a system for inspecting a plurality of objects is provided. The system includes an x-ray source and a detector arranged to receive x-rays from the x-ray source. A placement stage is disposed between the x-ray source and the detector. One or more processors configured to execute computer instructions when executed on the one or more processors to perform a method comprising: acquiring a first image of a fixture used for holding a plurality of objects by emitting x-rays with the x-ray source, passing at least a first portion of the x-rays through the fixture, and receiving the first portion of the x-rays with the detector, the fixture being positioned on the placement stage; generating a first electronic model of the fixture with the first image; acquiring a second image of the fixture and the plurality of objects by emitting x-rays with the x-ray source, passing at least a second portion of the x-rays through the fixture and the plurality of objects, and receiving the second portion of the x-rays with the detector, the fixture and plurality of objects being positioned on the placement stage, the plurality of objects being supported by the fixture; defining a third electronic model of the plurality of objects based at least in part on subtracting the first electronic model from the second electronic model; comparing dimensions of the objects from the third electronic model with a computer aided design (CAD) model; and outputting a report based at least in part on the comparison of the objects from the third electronic model with the CAD model.

In addition to one or more of the features described herein, or as an alternative, further embodiments of the system may include the method further comprising defining a bounding box around each of the plurality of objects. In addition to one or more of the features described herein, or as an alternative, further embodiments of the system may include the defining of the bounding box further comprises generating a histogram of the third electronic model and determining a first peak and a second peak in the histogram. In addition to one or more of the features described herein, or as an alternative, further embodiments of the system may include the first peak representing the background of the third electronic model and the second peak represents the plurality of objects.

In addition to one or more of the features described herein, or as an alternative, further embodiments of the system may include the method further comprising defining a threshold, the threshold being between the first peak and the second peak. In addition to one or more of the features described herein, or as an alternative, further embodiments of the system may include the bounding box is further defined by the threshold.

In addition to one or more of the features described herein, or as an alternative, further embodiments of the system may include the subtraction of the first electronic model from the second electronic model being performed voxel by voxel. In addition to one or more of the features described herein, or as an alternative, further embodiments of the system may include the method further comprising aligning a fixture portion of first electronic model with a fixture portion of the second electronic model. In addition to one or more of the features described herein, or as an alternative, further embodiments of the system may include the aligning being based on a best fit or an iterative closest point method. In addition to one or more of the features described herein, or as an alternative, further embodiments of the system may include the aligning being based on mechanical alignment of the fixture to a reproducible position within the system.

These and other advantages and features will become more apparent from the following description taken in conjunction with the drawings.

BRIEF DESCRIPTION OF DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

The detailed description explains embodiments of the disclosure, together with advantages and features, by way of example with reference to the drawings.

DETAILED DESCRIPTION

Embodiments of the present disclosure provide for a computed tomography (CT) system for inspecting parts. Embodiments of the present disclosure provide for a CT system that provides advantages in inspecting multiple parts simultaneously while being held in a fixture.

Figure 1:
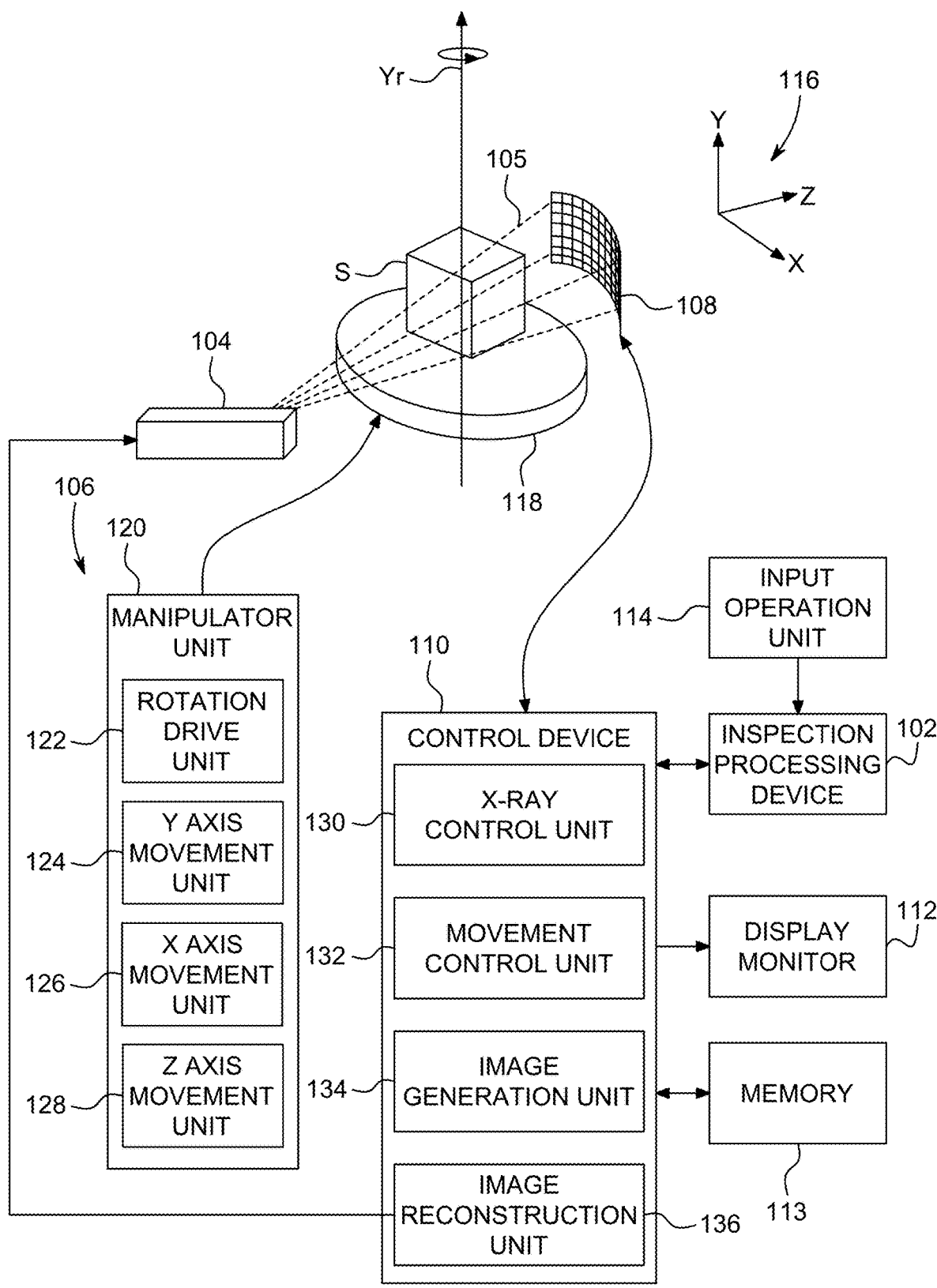
FIG. 1 is a schematic diagram of a computed tomography (CT) inspection system.
Figure 2:
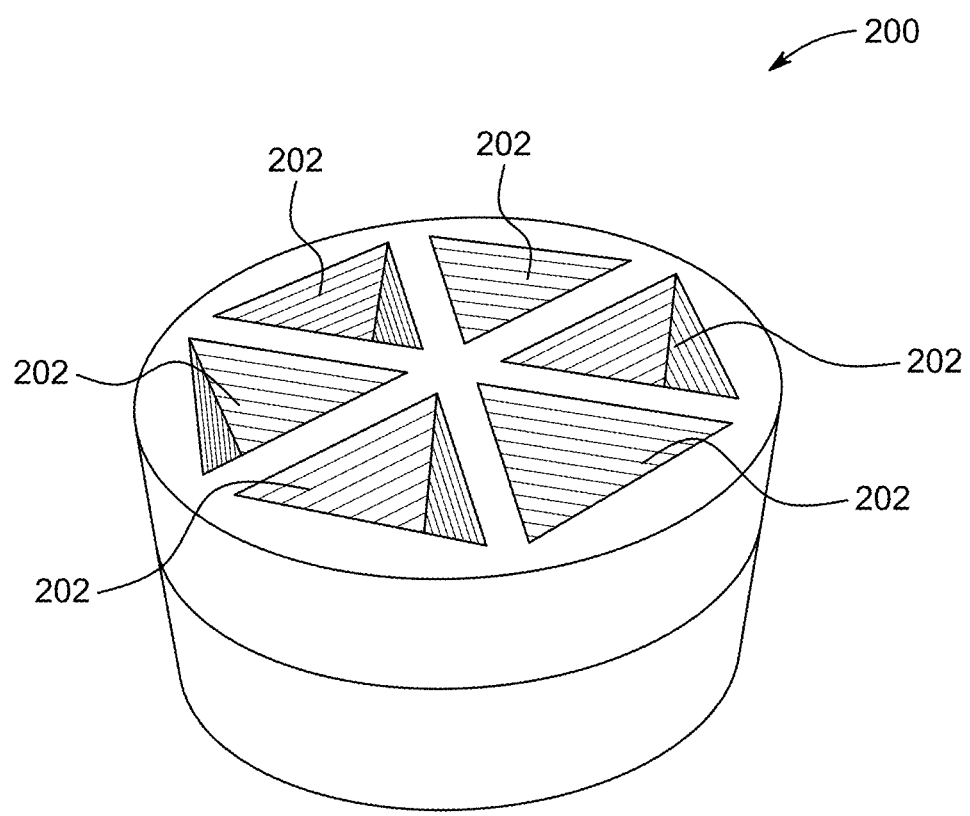
FIG. 2 is a perspective view of a fixture for use in the CT inspection system of FIG. 1.

Referring now to FIG. 1, an embodiment of a CT system 100 for inspecting parts being held by a fixture, such as the fixture 200 shown in FIG. 2. It should be appreciated that while embodiments herein may illustrate or describe a particular type of CT system, this is for example purposes and the claims should not be so limited. In other embodiments, other types of CT systems having other trajectory, detector shape, or beam geometry, such as a fan-type or a cone-type CT system for example, may also be used. The system 100 includes an inspection processing device 102, an x-ray source 104, a placement unit 106, a detector 108, a controller 110, a display 112, and a input device 114. In an embodiment, the x-ray source 104 emits x-rays in a cone shape 105 in the Z direction in the coordinate frame of reference 116 along an optical axis from an emission point in accordance with control by the control device 106. The emission point corresponds to the focal point of the x-ray source 104. That is the optical axis connects the emission point, which is the focal point of the x-ray source 104, with the center of the imaging capture region of the detector 108. It should be appreciated that the x-ray source 104, instead of one emitting x-rays in a cone shape, can also be one emitting x-rays in a fan-shape for example.

The placement unit 106 is provided with a placement stage 118 on which the specimen S is placed, and a manipulator unit 120. In an embodiment, the manipulator unit 120 includes a rotation device unit 122, an Y-axis movement unit 124, an X-axis movement unit 126, and a Z-axis movement unit 128. The placement stage 118 or the x-ray source 104 may be configured to be rotatable by the rotation drive unit 122.

The rotation drive unit 122 is, for example, configured by an electric motor or the like, is parallel to the Y-axis and rotates the x-ray source 104 with an axis passing through the center of the placement unit 118. In an embodiment, the rotation drive unit 122 may be configured to rotate the placement unit 118, such as by an electronic motor for example, to rotate the placement unit 118 about an axis passing through the center of the x-ray source 104. The Y-axis movement unit 124, the X-axis movement unit 126, and the Z-axis movement 128 are controlled by the control device 110. The movement of the placement stage in the X-axis direction, the Y-axis direction and the Z-axis direction are controlled by the control device 110 such that the specimen S is positioned in the emission range of the x-rays emitted by the x-ray generation unit 104. In an embodiment, the Z-axis movement unit 126 is controlled by the control unit 110, and moves the placement stage 118 in the Z-axis direction so that the distance from the x-ray source 104 to the specimen S is a distance wherein the specimen S in the capture image is at the desired magnification ratio.

The detector 108 is provided on an opposite side of the placement stage 118 from the x-ray source 104. In an embodiment, the detector 108 is an area sensor, which has an incident surface extending along the XY plane. X-rays that pass through the specimen S on the placement stage 118 emitted from the x-ray source 104 are incident upon the incident surface of the detector 108. The detector 108 may include a scintillator unit, a photomultiplier tube, a light receiving unit, and the like as is known in the art. The scintillator unit converts the energy of the x-rays to light energy, such as visible light or ultraviolet light, amplifies it with the photomultiplier tube, converts the amplified light energy to electrical energy with the light receiving unit and outputs it as an electrical signal to the control device 110.

It should be appreciated that the detector 108 described herein is for example purposes and other suitable type of detectors as is known in the art may be used. In other embodiments, for example, the detector 108 may be a one-dimensional line detector.

The x-ray source 104, the placement stage 118, and the detector 108 are supported by a frame (not shown). The frame is constructed having sufficient rigidity. Thus, it is possible to stably support the x-ray source 104, the placement stage 118, and detector 108 while acquiring a projected image of the specimen S. In an embodiment, the frame is supported by an anti-vibration mechanism (not shown) to prevent vibration generated on the outside from being transmitted to the frame.

The input operation unit 114 is configured by an input device (e.g. keyboard, various buttons, a mouse) and is used by the operator to control the operation of the system 100. The control device 110 is a microprocessor based system that controls different modules of the system 100. The control device 110 includes an x-ray control module 130, a movement control module 132, an image generation module 134, and an image reconstruction module 136. The x-ray control module 130 controls the operation of the x-ray source 104. The movement control module 132 controls the movement of the manipulator 120. The image generation module generates x-ray projected image data for the specimen S based on an output signal from detector 108. The image reconstruction module 136 performs image reconstruction processing that creates a reconstructed image based on the projector image data for specimen S from each different projection direction as is known in the art.

The reconstructed image is an image illustrating the structure of the interior and exterior of the specimen S that is positioned in between the x-ray source 104 and the detector 108. In an embodiment, the reconstructed image is output as voxel data. The voxel data is an absorption coefficient distribution of the specimen S. In an embodiment where the system 100 is a fan beam type CT system, three-dimensional shape information (e.g. the internal structure of the specimen S) may be generated by a surface model construction module within the image reconstruction module 136 based at least in part on the reconstructed image acquired at different positions in the Y-direction. In an embodiment, back projection, filtered back projection, and iterative reconstruction may be used in image reconstruction processing.

In the processing of specimen S a fixture or support structure, such as fixture 200 shown in FIG. 2, may be used to hold the specimen S in a desired orientation. Further, when the specimen S is small, the operator may desire to scan multiple specimens S simultaneously. In this embodiment, the fixture 200 may include a plurality of features, such as openings 202 that are sized to support or receive the specimens S.

In the illustrated embodiment, the fixture 200 is made from a material that has a lower density than the part being inspected to reduce the effect of the absorption of x-rays from x-ray source 104 by the fixture 200 and the surfaces of the fixture 200 that touch the part being inspected. It should be appreciated that even for low density material such as a foam material, the fixture 200 may still cause irregularities at the part surface where the fixture touches the part. In existing metrology systems, the accurate determination of these fixture and surface irregularities in the 3D voxel data can be difficult or impossible.

Figure 3:
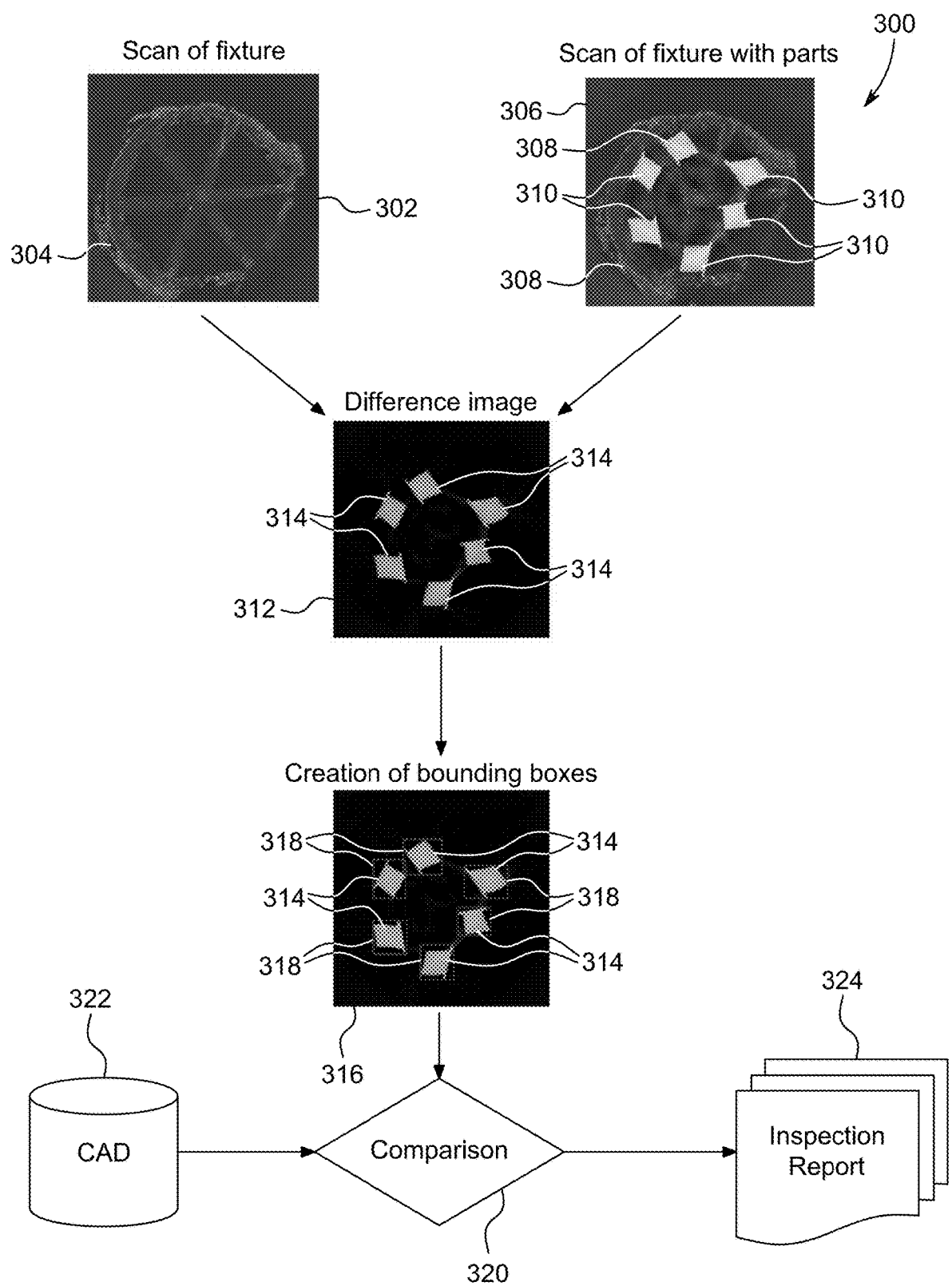
FIG. 3 is a flow diagram of a method of inspecting parts using the CT inspection system FIG. 1.

Referring now to FIG. 3, a method 300 of inspection parts using a CT system, such as CT system 100 for example is shown. The method 300 begins in step 302 where an image 304 of the fixture 200 is generated. In an embodiment, step 302 includes placing the fixture 200 on the placement stage 118 and emitting x-rays from the x-ray source 104. The x-rays are received by the detector 108 and processed by the image reconstruction unit 136 to form a first three-dimensional electronic model based at least in part on the voxels of the fixture. The method 300 then proceeds to block 306 where the parts are placed within the fixture 200. In block 306 an image 308 of the fixture and the parts 310 is generated. In an embodiment, step 306 includes placing the fixture 200 filled with parts on the placement stage 118 and emitting x-rays from the x-ray source 104. The x-rays are received by the detector 108 and processed by the image reconstruction unit 136 to form a second three-dimensional electronic model of the combined fixture and parts. The x-ray imaging parameters used in block 306 are the same as the ones used in block 302. It should be appreciated that block 302 and block 306 may be performed in any order. Moreover, step 302 can be performed in advance, for example when initializing the system or even before the system leaves the factory, and the first three-dimensional electronic model can be stored to and loaded from memory 113 (FIG. 1) for each new measurement performed with this fixture. For this purpose, fixtures can be labelled as to be recognized by the system when loaded.

The method 300 then proceeds to block 312 where a difference image is generated by subtracting the first three-dimensional electronic model from the second electronic model. In an embodiment, the subtraction is performed voxel by voxel. In order to perform a meaningful subtraction, the fixture portion of the first electronic model is aligned with the fixture portion of the second electronic model. In an embodiment the alignment can be done by using a best fit or iterative closest point (ICP) methods for example on surface models generated from the first and the second electronic models. In another embodiment, the alignment of the two electronic models can be done by mechanically aligning the position of the fixture to be identical for both steps 302 and 306. Then, the gray value of the voxels in the first electronic model are subtracted from the gray values of the voxels in the second electronic model that correspond to the voxels in the first electronic model. It should be appreciated that this results in the generation of a third three-dimensional electronic model that includes only the parts 314 that are being inspected. In an embodiment where a plurality of parts are being inspected simultaneously, the method 300 then proceeds to block 316 where bounding boxes 318 are disposed about each of the parts 314.

In an embodiment, a histogram of the gray values in the third electronic model is determined. It should be appreciated that in this histogram the background is represented by one peak and the material of the parts being inspected is represented by a second peak. In some embodiments, a threshold is determined with a gray value being in the middle between the peaks. Based at least in part on this threshold the image is binarized. In this binarized image, connected components are found using image analysis as is known in the art. In an embodiment, the connecting of components is known as "labeling features in an array." One type of labeling features in an array is referred to as a SciPy function called scipy.ndimage.measurements.label available from SciPy.org. Around each identified connected component the three-dimensional bounding box 318 is generated. In an embodiment, a function called scipy.ndimage.measurements.find_objects provided by SciPy.org is used to define the bounding box. The list of bounding boxes is then filtered according to their sizes in order to eliminate bounding boxes created around noise.

In an embodiment, coordinates of these 3D bounding boxes 318 are transferred to the third electronic model to create 3D electronic models or datasets for each of the parts being imaged. In an embodiment, the process of defining a histogram, finding peaks, determining a threshold and labelling features is repeated to identify residual voxels from other connected components that are overlapping within the 3D bounding box 318. The residuals are identified by size and their position which is usually at the edge of the bounding box and are removed.

The method 300 then proceeds to query block 320 where computer aided design (CAD) data is retrieved from a database 322. The CAD data is compared with surface models generated from the electronic models of the individual parts (defined by the bounding boxes 318) and dimensional inspections are performed. Since each of the electronic models of the individual parts may be correlated to a cavity 202 within the fixture 200, the method 300 outputs an inspection report 324. Due to the correlation between the electronic models of the individual parts with the cavities in the fixture, the operator can identify any parts that are out of specification based on the inspection report 324.

It should be appreciated that embodiments provided herein allow for the rapid and automated inspection of a plurality of parts simultaneously. This allows for a reduced cycle time and costs associated with inspections. Moreover, due to the subtraction of the first electronic model from the second electronic model, the influence of the surfaces of the fixture 200 that touch the part being inspected can be reduced or eliminated completely, even if the density of the fixture material is similar to the density of the part being inspected. This allows for using more robust materials than foam materials which are much more suited for the production environment.

The term "about" is intended to include the degree of error associated with measurement of the particular quantity based upon the equipment available at the time of filing the application.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection." It should also be noted that the terms "first", "second", "third", "upper", "lower", and the like may be used herein to modify various elements. These modifiers do not imply a spatial, sequential, or hierarchical order to the modified elements unless specifically stated.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A method of inspecting a plurality of objects using a computed tomography (CT) system, the method comprising:
   acquiring an image of a fixture used for holding the plurality of objects with the CT system;
   generating a first electronic model of the fixture;
   placing the plurality of objects in the fixture;
   acquiring an image of the fixture and the plurality of objects with the CT system;
   generating a second electronic model of the fixture and the plurality of objects;
   defining a third electronic model of the plurality objects based at least in part on subtracting the first electronic model from the second electronic model;
   comparing dimensions of the objects from the third electronic model with a computer aided design (CAD) model; and
   outputting a report based at least in part on the comparison of the objects from the third electronic model with the CAD model.

2. The method of claim 1, further comprising defining a bounding box around each of the plurality of objects.

3. The method of claim 2, wherein the defining of the bounding box includes generating a histogram of the third electronic model and determining a first peak and a second peak in the histogram.

4. The method of claim 3, wherein the first peak represents the background of the third electronic model and the second peak represents the plurality of objects.

5. The method of claim 4, further comprising defining a threshold, the threshold being between the first peak and the second peak.

6. The method of claim 5, wherein the bounding box is defined by the threshold.

7. The method of claim 1, wherein the subtraction of the first electronic model from the second electronic model is performed voxel by voxel.

8. The method of claim 7, further comprising aligning a fixture portion of first electronic model with a fixture portion of the second electronic model.

9. The method of claim 8, wherein the aligning is based on a best fit or an iterative closest point method.

10. The method of claim 8, wherein the aligning is based on mechanical alignment of the fixture to a reproducible position within the CT system.

11. A system for inspecting a plurality of objects, the system comprising:
   a x-ray source;
   a detector arranged to receive x-rays from the x-ray source;
   a placement stage disposed between the x-ray source and the detector; and
   one or more processors configured to execute computer instructions when executed on the one or more processors to perform a method comprising:
      acquiring a first image of a fixture used for holding a plurality of objects by emitting x-rays with the x-ray source, passing at least a first portion of the x-rays through the fixture, and receiving the first portion of the x-rays with the detector, the fixture being positioned on the placement stage;

generating a first electronic model of the fixture with the first image;

acquiring a second image of the fixture and the plurality of objects by emitting x-rays with the x-ray source, passing at least a second portion of the x-rays through the fixture and the plurality of objects, and receiving the second portion of the x-rays with the detector, the fixture and plurality of objects being positioned on the placement stage, the plurality of objects being supported by the fixture;

defining a third electronic model of the plurality of objects based at least in part on subtracting the first electronic model from the second electronic model;

comparing dimensions of the objects from the third electronic model with a computer aided design (CAD) model; and outputting a report based at least in part on the comparison of the objects from the third electronic model with the CAD model.

12. The system of claim 11, wherein the method further comprises defining a bounding box around each of the plurality of objects.

13. The system of claim 12, wherein the defining of the bounding box includes generating a histogram of the third electronic model and determining a first peak and a second peak in the histogram.

14. The system of claim 13, wherein the first peak represents the background of the third electronic model and the second peak represents the plurality of objects.

15. The system of claim 14, wherein the method further comprises defining a threshold, the threshold being between the first peak and the second peak.

16. The system of claim 15, wherein the bounding box is defined by the threshold.

17. The system of claim 11, wherein the subtraction of the first electronic model from the second electronic model is performed voxel by voxel.

18. The system of claim 17, wherein the method further comprises aligning a fixture portion of first electronic model with a fixture portion of the second electronic model.

19. The method of claim 18, wherein the aligning is based on a best fit or an iterative closest point method.

20. The method of claim 18, wherein the aligning is based on mechanical alignment of the fixture to a reproducible position within the system.

* * * * *

UNITED STATES PATENT AND TRADEMARK OFFICE
CERTIFICATE OF CORRECTION

| | |
|---|---|
| PATENT NO. | : 11,719,651 B2 |
| APPLICATION NO. | : 17/340902 |
| DATED | : August 8, 2023 |
| INVENTOR(S) | : Stiebeiner et al. |

It is certified that error appears in the above-identified patent and that said Letters Patent is hereby corrected as shown below:

On the Title Page

In the Inventors:
At Column 1, Line No. 8:
Inventor Name "Georgio Balatzis" should be replaced with inventor name "Georgios Balatzis"

Signed and Sealed this
Thirty-first Day of December, 2024

Derrick Brent
*Acting Director of the United States Patent and Trademark Office*